United States Patent
Matsuura

(10) Patent No.: US 7,512,913 B2
(45) Date of Patent: Mar. 31, 2009

(54) DESIGNING APPARATUS, DESIGNING METHOD, AND PROGRAM THEREOF

(75) Inventor: Takashi Matsuura, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 296 days.

(21) Appl. No.: 11/394,322

(22) Filed: Mar. 31, 2006

(65) Prior Publication Data
US 2007/0150845 A1 Jun. 28, 2007

(30) Foreign Application Priority Data
Dec. 26, 2005 (JP) ............................. 2005-372906

(51) Int. Cl.
*G06F 17/50* (2006.01)
*G06F 9/45* (2006.01)
(52) U.S. Cl. ............................................. 716/4; 716/5
(58) Field of Classification Search ................... None
See application file for complete search history.

(56) References Cited
U.S. PATENT DOCUMENTS

| 6,182,268 | B1* | 1/2001 | McElvain | 716/1 |
| 6,735,743 | B1* | 5/2004 | McElvain | 716/4 |
| 7,007,251 | B2* | 2/2006 | Hekmatpour | 716/4 |

FOREIGN PATENT DOCUMENTS

| JP | 2001-14365 | 1/2001 |
| JP | 2005-12086 | 1/2005 |
| JP | 2005-284426 | 10/2005 |
| JP | 2005-309623 | 11/2005 |
| JP | 2005-316595 | 11/2005 |

OTHER PUBLICATIONS

S. Kowatari, et al., "Coverage-Driven IP Macro Interface Verification Method", Fujitsu 55.6, Nov. 2004, pp. 596-602.

* cited by examiner

*Primary Examiner*—Leigh Marie Garbowski
(74) *Attorney, Agent, or Firm*—Fujitsu Patent Center

(57) ABSTRACT

An apparatus and a program detect an error state of FSM coverage measurement, and shorten the checking time. The program for use in the FSM coverage measurement based on the language-described logical circuit and test bench is used to direct a computer to perform: a function of extracting an FSM configuration from the language description and the design information generated based on the language description; an extracting function of expanding the hierarchical levels of modules in the range of performing trace back from a variable as input of the FSM to output of a flip-flop or external input of a top module, and extracting FSM input logic between the hierarchical levels in response to the input of a module; and a detecting function of detecting whether or not there is a state that is never reached or a transition that never occurs by an arithmetic result based on the logic having exclusivity detected in the FSM input logic and FSM transition logic.

14 Claims, 16 Drawing Sheets

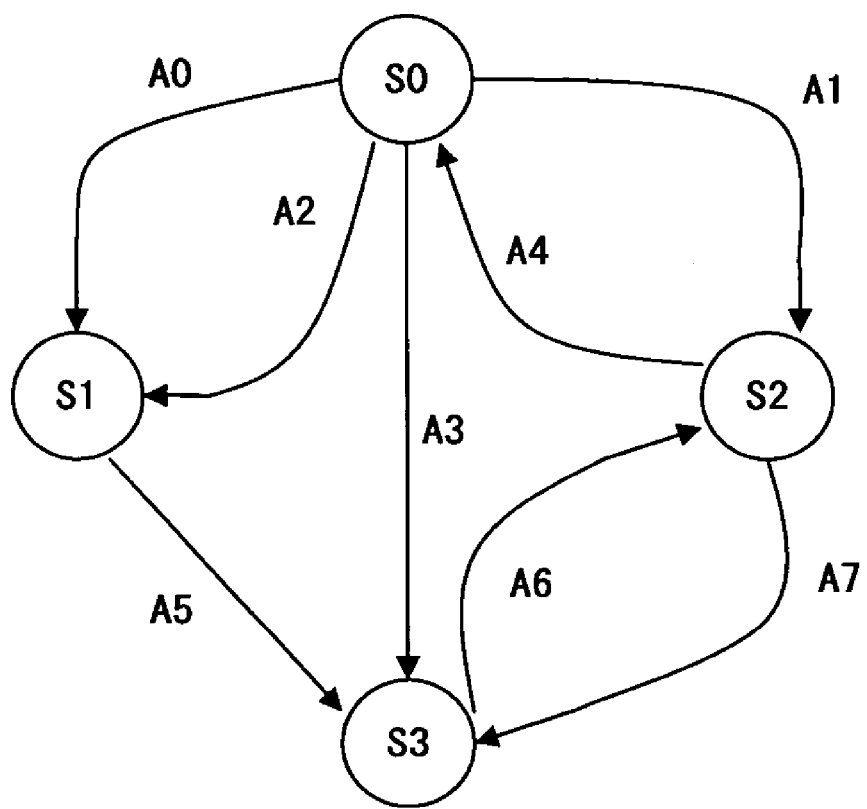
F I G. 1

```
1   module sample1 (CLK,RST,i1,i2,cur_stat);
2     input         CLK;
3     input         RST;
4     input         i1, i2;
5     output [2:0]  cur_stat;
6
7     wire w = i1 & i2 | ~i1 | ~i2;
8     sample1_fsm inst(CLK,RST,i1,1'b1,w,cur_stat);
9
10  endmodule
11
12  module sample1_fsm (CLK,RST,i1,i2,i3,cur_stat);
13    input         CLK;
14    input         RST;
15    input         i1, i2, i3;
16    output [2:0]  cur_stat;
17    reg    [2:0]  cur_stat, nxt_stat, state;
18
19    parameter S0 = 3'b001;
20    parameter S1 = 3'b010;
21    parameter S2 = 3'b100;
22    parameter S3 = 3'b011;
23    parameter S4 = 3'b111;
24
25    always @(posedge CLK or negedge RST) begin
26      if (~RST) cur_stat <= S0;
27      else      cur_stat <= nxt_stat;
28    end
29
30    always @(cur_stat or i1 or i2 or i3) begin
31      case (cur_stat)
32        S0: if (i1)      nxt_stat = S1;
33            else if (i2) nxt_stat = S2;
34            else         nxt_stat = S3;
35        S1: if (i3)      nxt_stat = S0;
36            else         nxt_stat = S4;
37        S2:              nxt_stat = S0;
38        S3:              nxt_stat = S0;
39        S4:              nxt_stat = S0;
40        default:         nxt_stat = S0;
41      endcase
42    end
43
44  endmodule
```

(CONVENTIONAL FSM COVERAGE MEASUREMENT RESULT)
State Coverage : 60% (3/5)

| State | Encoding | Num of Visits |
|---|---|---|
| S0 | 001 | 2501 |
| S1 | 010 | 1243 |
| S2 | 100 | 1257 |
| S3 | 011 | 0 |
| S4 | 111 | 0 |

Inputs = (i1, i2, i3)

B

Arc Coverage : 50% (4/8)

| P-State | N-State | Inputs | Num of Visits |
|---|---|---|---|
| S0 | S1 | 1-- | 1243 |
|  | S2 | 01- | 1257 |
|  | S3 | 00- | 0 |
| S1 | S0 | --1 | 1243 |
|  | S4 | --0 | 0 |
| S2 | S0 | --- | 1257 |
| S3 | S0 | --- | 0 |
| S4 | S0 | --- | 0 |

C

(FSM COVERAGE MEASUREMENT RESULT BY CONSTANT PROPAGATION)
State Coverage : 100% (3/3)

| State | Encoding | Num of Visits |
|---|---|---|
| S0 | 001 | 2501 |
| S1 | 010 | 1243 |
| S2 | 100 | 1257 |

Inputs = (i1, i2, i3)

D

Arc Coverage : 100% (4/4)

| P-State | N-State | Inputs | Num of Visits |
|---|---|---|---|
| S0 | S1 | 1-- | 1243 |
|  | S2 | 01- | 1257 |
| S1 | S0 | --1 | 1243 |
| S2 | S0 | --- | 1257 |

F I G. 8

```
1   module sample2 (CLK,RST,i1,i2,i3,cur_stat);
2     input       CLK;
3     input       RST;
4     input       i1, i2, i3;
5     output [2:0] cur_stat;
6
7     wire R;
8
9     sample2_ff   inst_ff(CLK,RST,i2,R);
10    sample2_fsm  inst_fsm(CLK,RST,i1,i2,i3,R,cur_stat);
11
12  endmodule
13
14  module sample2_ff (CLK,RST,i2,R);
15    input       CLK;
16    input       RST;
17    input       i2;
18    output      R;
19    reg         R;
20
21    always @(posedge CLK or negedge RST)
22      if (RST == 0)
23        R <= 1'b0;
24      else
25        R <= i2;
26
27  endmodule
28
29  module sample2_fsm (CLK,RST,i1,i2,i3,R,cur_stat);
30    input       CLK;
31    input       RST;
32    input       i1, i2, i3, R;
33    output [2:0] cur_stat;
34    reg    [2:0] cur_stat, nxt_stat, state;
35
36    parameter S0 = 3'b001;
37    parameter S1 = 3'b010;
38    parameter S2 = 3'b100;
39    parameter S3 = 3'b011;
40    parameter S4 = 3'b110;
41
42    always @(posedge CLK) begin
43      if (~RST) cur_stat <= S0;
44      else      cur_stat <= nxt_stat;
45    end
46
47    wire C0 = i1 & i2;
48    wire C1 = i1 & R;
49    wire C2 = R & i3;
50    wire C3 = R & ~i3;
51
52    always @(cur_stat or C0 or C1 or C2 or C3) begin
53      case (cur_stat)
54        S0: if (C1)
55              if (C2)        nxt_stat = S1;
56              else if (C3)   nxt_stat = S2;
57              else           nxt_stat = S3;
58            else             nxt_stat = S4;
59        S1: if (C0)
60              if (C2)        nxt_stat = S0;
61              else if (C3)   nxt_stat = S1;
62              else           nxt_stat = S2;
63            else             nxt_stat = S4;
64        S2:                  nxt_stat = S0;
65        S3:                  nxt_stat = S0;
66        S4:                  nxt_stat = S0;
67        default:             nxt_stat = S0;
68      endcase
69    end
70
71  endmodule
```

FIG. 9

(TRANSITION COVER IN STATE S0)

| i1 | R | i3 | C1 | C2 | C3 | nxt_stat |
|---|---|---|---|---|---|---|
| 0 | 0 | 0 | 0 | 0 | 0 | S4 |
| 0 | 0 | 1 | 0 | 0 | 0 | S4 |
| 0 | 1 | 0 | 0 | 0 | 1 | S4 |
| 0 | 1 | 1 | 0 | 1 | 0 | S4 |
| 1 | 0 | 0 | 0 | 0 | 0 | S4 |
| 1 | 0 | 1 | 0 | 0 | 0 | S4 |
| 1 | 1 | 0 | 1 | 0 | 1 | S2 |
| 1 | 1 | 1 | 1 | 1 | 0 | S1 |

F I G. 1 0

(TRANSITION COVER IN STATE S1)

| i1 | i2 | R | i3 | C0 | C2 | C3 | nxt_stat |
|---|---|---|---|---|---|---|---|
| 0 | 0 | 0 | 0 | 0 | 0 | 0 | S4 |
| 0 | 0 | 0 | 1 | 0 | 0 | 0 | S4 |
| 0 | 0 | 1 | 0 | 0 | 0 | 1 | S4 |
| 0 | 0 | 1 | 1 | 0 | 1 | 0 | S4 |
| 0 | 1 | 0 | 0 | 0 | 0 | 0 | S4 |
| 0 | 1 | 0 | 1 | 0 | 0 | 0 | S4 |
| 0 | 1 | 1 | 0 | 0 | 0 | 1 | S4 |
| 0 | 1 | 1 | 1 | 0 | 1 | 0 | S4 |
| 1 | 0 | 0 | 0 | 0 | 0 | 0 | S4 |
| 1 | 0 | 0 | 1 | 0 | 0 | 0 | S4 |
| 1 | 0 | 1 | 0 | 0 | 0 | 1 | S4 |
| 1 | 0 | 1 | 1 | 0 | 1 | 0 | S4 |
| 1 | 1 | 0 | 0 | 1 | 0 | 0 | S2 |
| 1 | 1 | 0 | 1 | 1 | 0 | 0 | S2 |
| 1 | 1 | 1 | 0 | 1 | 0 | 1 | S1 |
| 1 | 1 | 1 | 1 | 1 | 1 | 0 | S0 |

F I G. 1 1

A

(CONVENTIONAL FSM COVERAGE RESULT)
State Coverage : 80% (4/5)

| State | Encoding | Num of Visits |
|---|---|---|
| S0 | 001 | 2349 |
| S1 | 010 | 318 |
| S2 | 100 | 313 |
| S3 | 011 | 0 |
| S4 | 111 | 2201 |

Inputs = (C2, C3, C0, C1)

B

Arc Coverage : 81% (9/11)

| P-State | N-State | Inputs | Num of Visits |
|---|---|---|---|
| S0 | S1 | 1--1 | 301 |
|  | S2 | 01-1 | 283 |
|  | S3 | 00-1 | 0 |
|  | S4 | ---0 | 1764 |
| S1 | S0 | 1-1- | 14 |
|  | S1 | 011- | 17 |
|  | S2 | 001- | 30 |
|  | S4 | --0- | 257 |
| S2 | S0 | ---- | 313 |
| S3 | S0 | ---- | 0 |
| S4 | S0 | ---- | 2021 |

C

(FSM COVERAGE MEASUREMENT RESULT BY LOGICAL OPTIMIZATION)
State Coverage : 100% (4/4)

| State | Encoding | Num of Visits |
|---|---|---|
| S0 | 001 | 2349 |
| S1 | 010 | 318 |
| S2 | 100 | 313 |
| S4 | 111 | 2021 |

Inputs = (C2, C3, C0, C1)

D

Arc Coverage : 100% (9/9)

| P-State | N-State | Inputs | Num of Visits |
|---|---|---|---|
| S0 | S1 | 1--1 | 301 |
|  | S2 | 01-1 | 283 |
|  | S4 | ---0 | 1764 |
| S1 | S0 | 1-1- | 14 |
|  | S1 | 011- | 17 |
|  | S2 | 001- | 30 |
|  | S4 | --0- | 257 |
| S2 | S0 | ---- | 313 |
| S4 | S0 | ---- | 2021 |

F I G. 1 4

```
1  module sample3 (CLK, RST, i1, i2, i3, i4, i5, cur_stat);
2    input          CLK;
3    input          RST;
4    input          i1, i2, i3, i4, i5;
5    output [2:0]   cur_stat;
6    reg    [2:0]   cur_stat, nxt_stat, state;
7
8    parameter S0 = 3'b001;
9    parameter S1 = 3'b010;
10   parameter S2 = 3'b100;
11   parameter S3 = 3'b011;
12   parameter S4 = 3'b110;
13   parameter S5 = 3'b111;
14
15   always @(posedge CLK) begin
16     if (~RST)   state <= S0;
17     else if (i1) state <= nxt_stat;
18     else if (i2) state <= cur_stat;
19     else        state <= state;
20   end
21
22   always @(posedge CLK) begin
23     if (~RST)   cur_stat <= S0;
24     else if (i2) cur_stat <= S5;
25     else        cur_stat <= nxt_stat;
26   end
27
28   always @(cur_stat or i1 or i2 or i3 or i4 or i5 or state) begin
29     case (cur_stat)
30       S0: if (i1)
31             if (i2)          nxt_stat = S1;
32             else if (i3)     nxt_stat = S2;
33             else             nxt_stat = S1;
34           else               nxt_stat = S0;
35       S1: if (i4)            nxt_stat = S2;
36           else               nxt_stat = S1;
37       S2: if (i4)
38             if (i3)          nxt_stat = S3;
39             else             nxt_stat = S0;
40           else               nxt_stat = S2;
41       S3: if (state == S0)   nxt_stat = S5;
42           else if (i5)       nxt_stat = cur_state;
43           else               nxt_stat = S3;
44       S4:                    nxt_stat = S0;
45       S5: begin
46           else if (cur_state == S3) nxt_stat = S3;
47           else if (i1)       nxt_stat = state;
48           else if (i2)       nxt_stat = S4;
49           else               nxt_stat = S5;
50       default:               nxt_stat = S0;
51     endcase
52   end
53
54 endmodule
```

F I G. 1 5

US 7,512,913 B2

DESIGNING APPARATUS, DESIGNING METHOD, AND PROGRAM THEREOF

CROSS-REFERENCE TO RELATED APPLICATIONS

This application is based upon and claims the benefit of priority from the prior Japanese Patent Application No. 2005-372906 filed on Dec. 26, 2005, the entire contents of which are incorporated herein by reference.

BACKGROUND OF THE INVENTION

1. Field of the Invention

The present invention relates to a method for checking a designing apparatus, and more specifically to the technology of making a check using FSM coverage measurement.

2. Description of the Prior Art

Recently, a digital circuit design described in an HDL (hardware description language), etc. fully using an EDA (electronic design automation) tool is performed. In the design, unlike the conventional designing method, hardware designing is performed concurrently with the development of software so that the processes performed by software such as data processing, protocol processing, etc. can be realized by a digital circuit in many cases. Therefore, when the system of a large-scale logical circuit is designed by an HDL, etc. there is a tendency that a debugging time during designing and a checking time required for shipping necessarily increases.

For example, a model of a logical circuit designed by the HDL description is generally checked for verification by inputting a verification suite (test bench) to a simulator. The progress of the verification is determined by checking whether or not the activation of a logical expression and a conditional statement described in the RTL (register transfer level) description, the coverage rate of each state, and the transition between states are covered (compensated for) by an existing verification suite. One of the checking processes is coverage measurement. The coverage measurement is an important item. Although a check is performed without understanding the quality of a test bench itself for use in the check, quantitative quality improvement cannot be directly attained. The coverage measurement (code execution coverage rate, branch execution coverage rate, pass execution coverage rate, MC/DC, etc.) quantitatively grasps how sufficiently a check has been made to objectively discriminate whether or not the shipping can be performed.

However, when a check is made by the coverage evaluation performed by measuring the coverage (scope of the compensation), there can be a case where the coverage rate does not reach 100%. A research to designate a cause by checking the description contents to attain the coverage rate of 100% takes much time, thereby increasing the debugging time during designing and the checking time for shipping.

According to Japanese Published Patent Application No. 2001-014365, the RTL description and the verification suite are input to the function test coverage measurement device for measuring the function test coverage and the RTL simplifying device for simplifying the RTL description in order to evaluate the coverage. Then, a converted verification suite is output. The output verification suite is generated by deleting an unnecessary portion relating to a redundant portion of the RTL description in the test vector included in the input verification suite. Using such a verification suite, the checking time can be successfully shortened.

As a method of improving the coverage measurement, there is a method proposed of first raising the coverage to a certain extent in a black box test (test in which a source code is not confirmed), then detecting a path or a code which has not been processed, generating a test case to process the portion, and conducting again the test.

Considering the coverage measurement of an FSM (finite state machine), there are FSM state coverage for measurement to determine whether or not a defined state has been detected by extracting the FSM in a module unit, and FSM arc coverage for measurement to determine whether or not a transition has occurred by a conditional branch from each state. FIG. 1 shows the FSM. The method is generally expressed by the state (state: Sx) and the transition (arc: Ax). In the state machine shown in FIG. 1, there are a condition which changes by the transition indicated by the arrow A0 and a condition which changes in the route indicated by the arrow A2 as the conditions for transition to the state S1 from the state S0, and the transition causes a further transition to the next state of S1.

Similarly, when the condition from S0 to S2 is satisfied, the transition is performed in the route of the transition of A1. The transition to S3 is also performed through the route of A3. When a transition is performed from S1 to S3, the route of A5 is used. In the case of S2, the transition is performed to S0 and S3 respectively through the routes A4 and A7. In the case of S3, the transition is performed to S2 through A6.

In the check, the states are covered if the transition is performed to all states using the four states from S0 to S3 as the total states. Similarly, when all transitions occur using eight transitions from A0 to A7 as the total transitions, the arcs are covered, thereby passing the check.

However, in the FSM state coverage, all defined as states (Sx) are included as a total number. Therefore, if an error state, etc. which causes no transition as a design intention is described, no transition occurs to the error state. Accordingly, the transition check result does not reach 100%. That is, when the total number of states (Sx) is set as a denominator and the number of actual transition states through a simulation, etc. is set as a numerator, the numerator is not equal to the denominator so far as there is a state that causes no transition. Therefore, the result is not 100%.

Furthermore, since the total number includes the transitions (Ax) optimized only in the module having the FSM description in the FSM arc coverage, the result of 100% is not attained when hierarchical levels of modules contain a constant description or an exclusive language description.

When the FSM coverage result does not reach 100% after performing a simulation, it is necessary to confirm whether or not there is a problem by extracting an uncovered portion and analyzing the cause. If the description includes no problem, an unnecessary cause analysis is performed, which is an inefficient operation.

SUMMARY OF THE INVENTION

The present invention aims at providing an apparatus and method for shortening the checking time by detecting an error state of FSM coverage measurement, and a recording medium storing the program for the apparatus and method.

An aspect of the present invention is a computer-readable recording medium storing a program for use in the FSM coverage measurement based on the language-described logical circuit and test bench to perform:

a function of extracting an FSM configuration from the language description and the design information generated based on the language description;

an extracting function of expanding the hierarchical levels of modules in the range of performing trace back from a variable as input of the FSM to output of a flip-flop or external input of a top module, and extracting FSM input logic between the hierarchical levels in response to the input of a module; and a detecting function of detecting whether or not there is a state that is never reached or a transition that never occurs by an arithmetic result based on the logic having exclusivity detected in the FSM input logic and FSM transition logic.

It is preferable that, in the computer-readable recording medium storing a program used to direct a computer according to the first aspect of the present invention to allow the detecting function to detect by constant propagation whether or not there is a state that is never reached or a transition that never occurs according to the arithmetic result based on the constant propagation logic detected in the FSM input logic and the FSM transition logic.

It is also preferable that, in the computer-readable recording medium storing a program used to direct a computer according to the first aspect of the present invention to allow the detecting function to perform optimization with the extracting function, and detect whether or not there is a state that is never reached or a transition that never occurs according to the arithmetic result based on the exclusive logic detected in the optimized FSM input logic and the FSM transition logic.

It is also preferable that, in the computer-readable recording medium storing a program used to direct a computer according to the first aspect of the present invention to perform output of the detecting function by subtracting the number of states that are never reached from the total amount of FSM state coverage, subtracting the number of transitions that never occur from the total amount of FSM arc coverage, performing the measurement of coverage and calculating the coverage rate, and outputting the result of the calculation.

Another aspect of the present invention is a computer-readable recording medium storing a program for use in the FSM coverage measurement based on the language-described logical circuit and test bench to direct a computer to perform:

an extracting function of extracting a configuration of an FSM from the language description and design information generated based on the language description;

a derivative variable extracting function of extracting a derivative variable in which an FSM register variable of the FSM is used as input;

a first state extracting function of extracting a state in which the derivative variable is used as a transition destination of the next state; and a second state extracting function of extracting a state in which the FSM register variable or the derivative variable is used as a transition condition of the FSM.

It is preferable that, in the computer-readable recording medium storing a program used to direct a computer to allow the arithmetic result of the first extracting function to be displayed.

It is preferable that, in the computer-readable recording medium storing a program used to direct a computer according to the fifth aspect of the present invention to allow the arithmetic result of the second extracting function to be displayed.

A further aspect of the present invention is a designing apparatus which performs FSM coverage measurement based on a language-described logical circuit and a test bench, and includes:

an FSM check unit for extracting an FSM configuration from the language description and design information generated based on the language description, expanding hierarchical levels of modules in the range of performing trace back from a variable as input of the FSM to output of a flip-flop or external input of a top module, performing constant propagation and optimization, checking before executing a simulation whether or not there is a state that is never reached or a transition that never occurs, and outputting the check result; and an FSM coverage measurement unit for subtracting the state that is never reached from a total amount of FSM state coverage, subtracting the transition that never occurs from a total amount of FSM arc coverage, performing the FSM coverage measurement based on the test bench, and outputting an FSM coverage result.

It is preferable that the designing apparatus further includes:

an extraction unit for extracting the configuration of the FSM from the language description and the design information generated based on the language description;

a derivative variable extraction unit for extracting a derivative variable in which an FSM register variable of the FSM is used as input;

a first state extraction unit for extracting a state in which the derivative variable is used as a transition destination of the next state; and a second state extraction unit for extracting a state in which the FSM register variable or the derivative variable is used as a transition condition of the FSM.

It is preferable that the detecting function detects by constant propagation whether or not there is a state that is never reached or a transition that never occurs according to the arithmetic result based on the constant propagation logic detected in the FSM input logic and the FSM transition logic.

It is preferable that the detecting function performs optimization with the extracting function, and detects whether or not there is a state that is never reached or a transition that never occurs according to the arithmetic result based on the exclusive logic detected in the optimized FSM input logic and the FSM transition logic.

It is preferable that output of the detecting function is performed by subtracting the number of states that are never reached from the total amount of FSM state coverage, subtracting the number of transitions that never occur from the total amount of FSM arc coverage, performing the measurement of coverage and calculating the coverage rate, and outputting the result of the calculation.

It is preferable that an arithmetic result of the first extracting function is displayed.

It is preferable that an arithmetic result of the second extracting function is displayed.

With the above-mentioned configuration, the state which is an exclusive state and is never reached and the transition that never occurs can be deleted in advance from the coverage rate before the FSM coverage measurement. Therefore, the FSM coverage measurement can be efficiently performed.

According to the present invention, the coverage measurement of the FSM generated based on the source described in the HDL can be efficiently performed.

BRIEF DESCRIPTION OF THE DRAWINGS

FIG. 1 shows the FSM;

FIG. 5 shows an example of the RTL description during checking the constant propagation;

FIG. 8 shows the result of measuring the FSM coverage of the RTL description shown in FIG. 5 in which FIG. 8A shows the conventional FSM state coverage measurement; FIG. 8B shows the conventional FSM arc coverage measurement; and FIG. 8C shows the FSM state coverage measurement according to the present invention; and FIG. 8D shows the FSM arc coverage measurement according to the present invention;

FIG. 9 shows an example of the RTL description during checking the optimization of logic;

FIG. 10 shows the transition cover of the state S0 of the RTL description shown in FIG. 9;

FIG. 11 shows the transition cover of the state S1 of the RTL description shown in FIG. 9;

FIG. 14 shows the result of measuring the FSM coverage of the RTL description shown in FIG. 9 in which FIG. 14A shows the conventional FSM state coverage measurement; FIG. 14B shows the conventional FSM arc coverage measurement; and FIG. 14C shows the FSM state coverage measurement according to the present invention; and FIG. 14D shows the FSM arc coverage measurement according to the present invention;

FIG. 15 shows an example of the RTL description according to the embodiment 2.

DESCRIPTION OF THE PREFERRED EMBODIMENTS

The embodiments of the present invention are described below in detail by referring to the attached drawings.

Embodiment 1

(System Configuration of the Present Invention)

Figure 2:
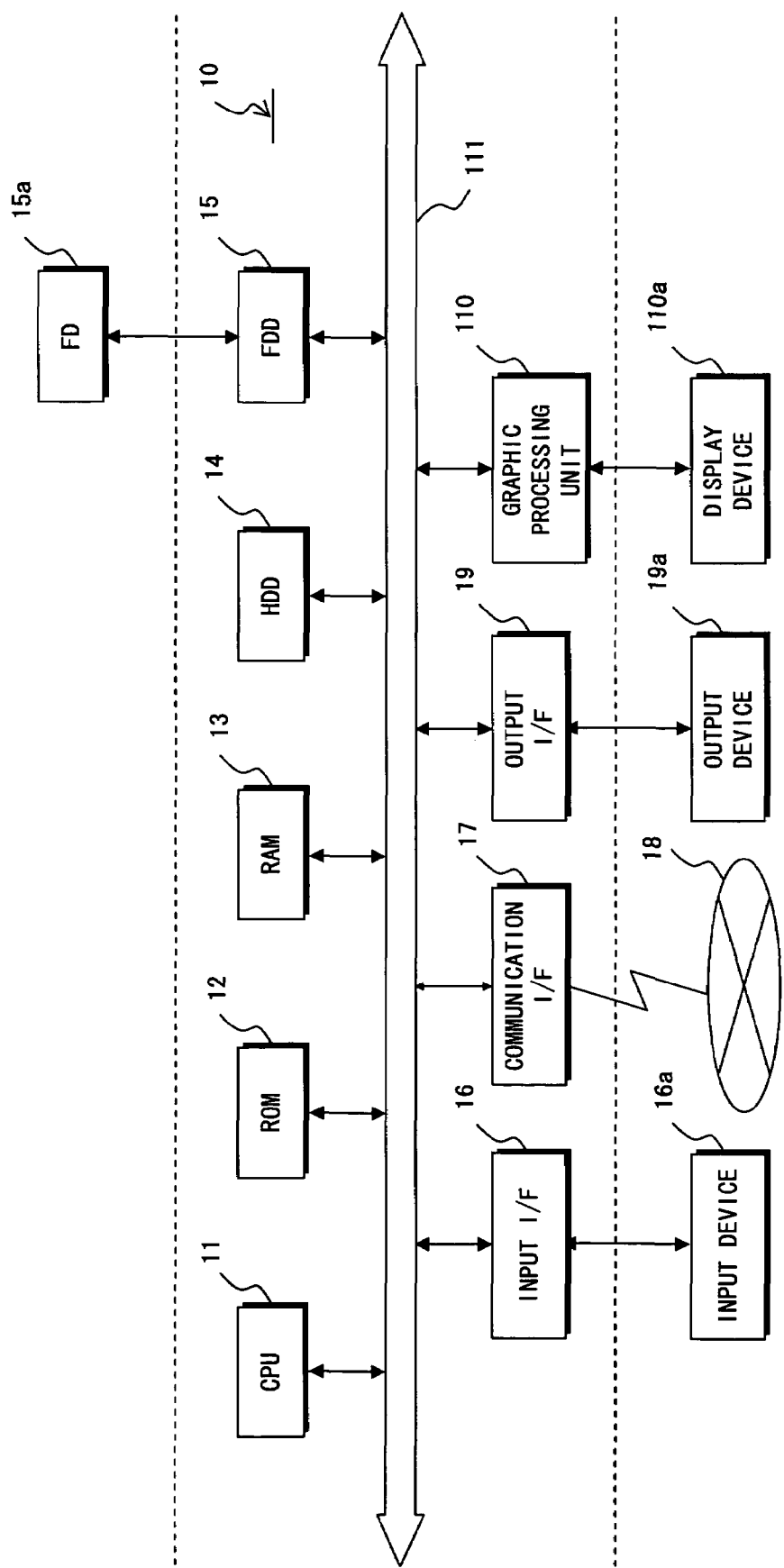
FIG. 2 shows the configuration of the system for realizing the present invention.

FIG. 2 is a block diagram showing the system configuration for realizing the present invention. In FIG. 2, a designing apparatus 10 comprises a CPU 11, ROM 12, RAM 13, a hard disk drive (HDD) 14, a flexible disk drive (FDD) 15, an input interface (input I/F) 16, a communication interface (communication I/F) 17, an output interface (output I/F) 19, a graphic processing unit 110, etc. Furthermore, each of the components is connected via a bus 111.

The CPU 11 performs the processes depending on the program and data stored in the ROM 12, RAM 13, HDD 14, and FDD 15, and controls the entire designing apparatus 10. The ROM 12 stores a basic program (boot-up program, etc.) executed by the CPU 11 and data. The RAM 13 stores a program being executed by the CPU 11 and data, and is used as a work area, etc.

The HDD 14 stores an OS (operating system) executed by the CPU 11, an application program, etc., and executes a read/write of data to a hard disk under the control of the CPU 11. The FDD 15 controls the read/write of the data to an FD 15a under the control of the CPU 11. The FD 15a stores the data written under the control of the FDD 15, and allows the designing apparatus 10 to read the data stored in the FD 15a. In addition to the FD 15a as a removable recording medium, a computer-readable recording medium can be a magnetic recording device, an optical disk, a magneto optical recording medium, semiconductor memory, etc. The magnetic recording device can be a hard disk device (HDD), a flexible disk (FD), a magnetic tape, etc. An optical disk can be a DVD (digital versatile disc), DVD-RAM (random access memory), CD-ROM (compact disc read only memory), CD-R (recordable)/RW (rewritable), etc. A magneto optical recording medium can be an MO (magneto-optical disk), etc.

A mouse and a keyboard is connected to the input I/F 16 which receives information input by a user, and transmits the information to the CPU 11 through the bus 111. The input I/F 16 can be an input pad as a touch panel, a ten key, etc. The mouse moves a cursor, selects a range, moves a window, changes its size, etc. A pointing device having similar functions can be a track ball, a joy stick, etc.

The communication I/F 17 is an interface for a LAN connection to other computers, an Internet connection, a wireless connection, etc. as necessary. Through a communication circuit 18, it is connected to another device through the network such as the Internet, etc. A network 18 and the internal interface control the input/output of the data from an external device. For example, a modem, a LAN adapter, etc. can be adopted.

The output I/F 19 is provided for control of an output device 19a such as a printer, etc. A display device 110a such as a display, etc. is connected to the graphic processing unit 110, and the graphic processing unit 110 displays operation information, a log after a logical simulation and an aggregate result of coverage, a signal waveform, etc. on the screen of the display device 110a according to a draw instruction from the CPU 11. For example, a CRT, a TFT liquid crystal display, a plasma display, etc. can be adopted. A display device can be connected from the output I/F 19 without the graphic processing unit 110.

(Principle of the Present Invention)

Figure 3:
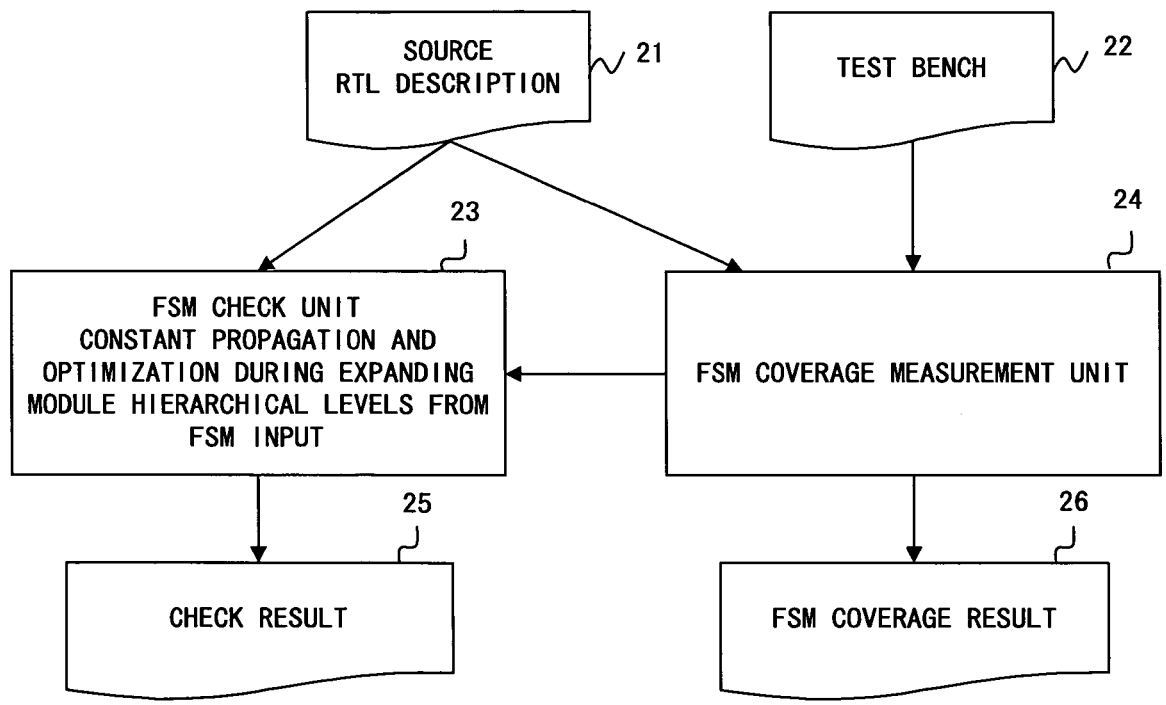
FIG. 3 is a block diagram showing the principle of the present invention.

FIG. 3 is a block diagram of the principle of the present invention.

A circuit description is performed using a language and, for example, a source 21 with the RTL description by, for example, an HDL, and a test bench 22 for use in performing a simulation are generated, and input to an FSM check unit 23 and an FSM coverage measurement unit 24.

Then, the input source 21 is fetched, a syntactic tree is generated, a variable, an arithmetic, a conditional statement, a loop statement, etc. included in the source 21 are analyzed to generate a control data flow graph (CDFG). The control data flow graph defines calculation as a node and data flow between arithmetic operations as an edge.

Based on the CDFG, a register required for holding a value is allocated, an FSM is recognized, and a state, a transition between the states, and a condition for causing a transition are generated. In the CDFG, a port, a signal, a logic/function operator, an assignment to a left side signal, conditions such as "IF", a "CASE" statement, etc. are represented as nodes, and the connection lines between the nodes are represented as arcs in an internal form.

Additionally, based on the CDFG, a scheduling process for determining the number of arithmetic units for performing a desired operation and the number of steps, and a process called "allocation (assigning a data path)" are performed. Furthermore, a register and an arithmetic unit corresponding to a variable and an arithmetic operation are assigned. When scheduling and assigning a data path are completed, a state machine for determining the sequence of a circuit and outputting a control signal of a data path is generated, and is converted to a RTL description which can be logically synthesized together with the description of the data path.

Although detailed explanation is not given, the actual CDFG is complicated including a branch, a loop, etc. Generally, the number of arithmetic units, the number of registers, the number of input/output terminals, access time, etc. are set as the restriction conditions of synthesizing an operation.

The FSM check unit 23 A) extracts an FSM (FSM extraction unit) from a file (data formed by a database, etc. including CDFG and equivalent data) storing converted design information corresponding to the description of a module forming the source 21, then B) expands hierarchical levels of modules in a range of tracing back from a variable as input of the FSM to the output of FF (flip-flop) or reaching the external input of the top module, the constant propagation unit detects constant propagation, the optimization unit performs optimization, and C) the check unit before executing a simulation checks before a simulation whether or not there is a state that is never reached or a transition that never occurs. A check before performing a simulation refers to a check 1) the description containing a state that is never reached, and 2) the description containing a transition that never occurs. A description can be a CDFG converted from a description or a database.

The FSM coverage measurement unit 24 D) deletes the number of states that are never reached and the number of transitions that never occur from the total amount of FSM coverage (FSM coverage total amount deletion unit), and E) performs FSM coverage measurement.

To delete the total amount of FSM coverage is F) to delete a state that is never reached from the total amount of FSM state coverage (state deletion unit), and G) to delete a transition that never occurs from the total amount of FSM arc coverage (arc deletion unit). Then, the FSM check unit 23 outputs a check result 25, and the FSM coverage measurement unit 24 outputs an FSM coverage result 26.

(Process according to the Present Invention)

Figure 4:
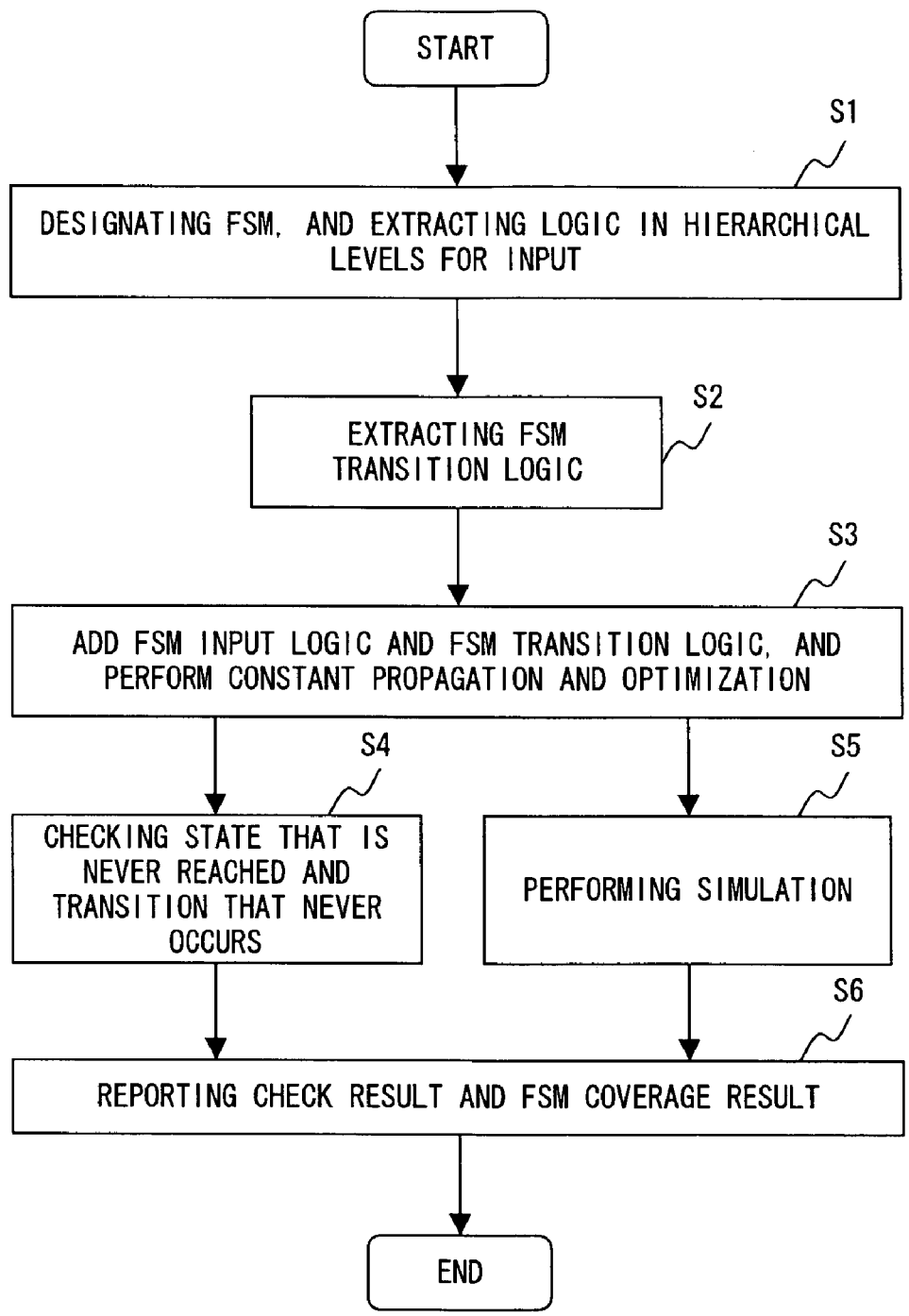
FIG. 4 shows the flow of the process contents of the present invention.

FIG. 4 shows a flow of the contents of the processes explained above.

In step (S1), an FSM is designated, and FSM input logic as logic between hierarchical levels in response to the module input is extracted. In step (S2), the FSM transition logic is extracted. In steps S1 and S2, an FSM is designated in a module unit by reading the source 21 of a logical circuit, hierarchical levels of modules are expanded from a variable as input to each FSM, and extraction is performed in a range in which trace back is performed until FF output or external input of a top module is reached (extracting function).

In step (S3), the extracted FSM input logic is added to the FSM transition logic, and logic having an influence on the FSM logic that never occurs exclusively is detected (detecting function). The detection can be performed on a portion propagating a constant, or on logic that never occurs exclusively after optimization.

In step (S4), a state that is never reached and a transition that never occurs are checked. In step (S5), a simulation is performed.

In step (S6), after making a check in S4 as to whether or not there is a state that is never reached or a transition that never occurs, the process is executed before a simulation, and a check result is output. Simultaneously, the FSM coverage measurement is also performed, thereby subtracting the state that is never reached from the total amount of FSM state coverage, also subtracting the transition that never occurs from the total amount of FSM arc coverage, and outputting a result.

(Check after Constant Propagation)

The RTL description (source 21: described in a sample verilog-HDL) shown in FIG. 5 is described with the module name "module sample 1" (lines 1 through 10) as a top module, and the "module sample 1" is a top module in the description range of lines 1 through 44. There is a lower module "sample1_fsm" at a hierarchical level below the top module.

Figure 6:
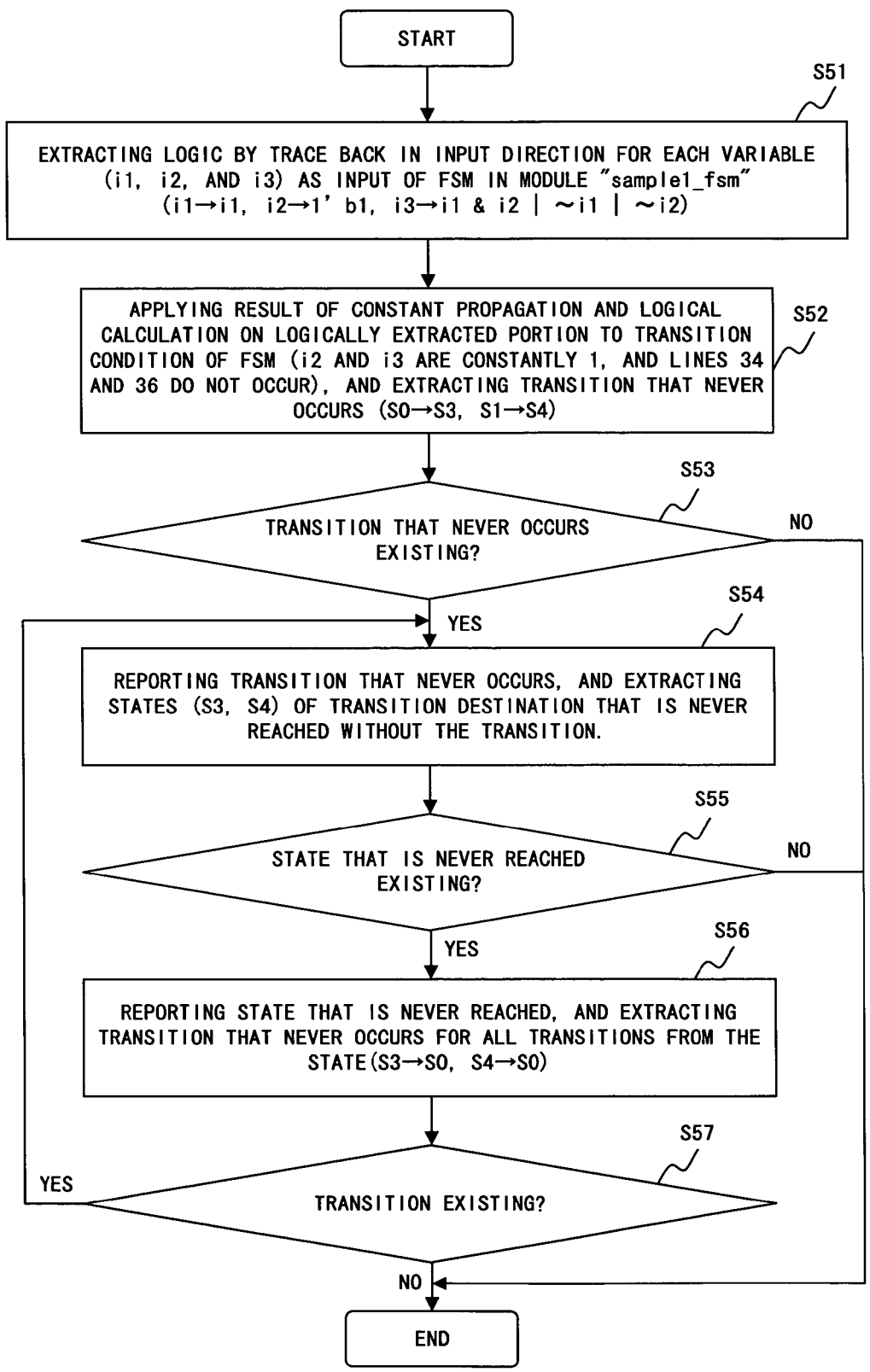
FIG. 6 shows the flow of the process performed based on the RTL description shown in FIG. 5.

FIG. 6 is a flowchart of the process based on the RTL description shown in FIG. 5. In step (S51), logic is extracted by trace back in the input direction for each of the variables i1, i2, and i3 as input of the FSM in the module "sample1_fsm". Extracted are i1→i1, i2→high (1'b1: indicating a constant 1 having a bit width of 1), and i3→i1 & i2|~i1|~i2.

In step (S52), a result of the logical calculation by the constant propagation on the logically extracted portion is applied to the transition condition of the FSM (i2 and i3 are always 1, and the lines 34 and 36 shown in FIG. 5 have not occurred), and an arcs (transitions) that never occur, that is, S0→S3 and S1→S4, are extracted.

In step (S53), it is discriminated whether or not there is a transition that never occurs. If there is no transition that never occurs as a result of the discrimination, the process terminates. If there is, control is passed to step (S54).

In step (S54), a transition that never occurs is reported, and states S3 and S4 which correspond to the states of the transition destination that are never reached without the transition are extracted.

In step (S55), it is discriminated whether or not there is a state that is never reached. If there is no state that is never reached as a result of the discrimination, the process terminates. If there is, control is passed to step (S56).

In step (S56), a state that is never reached is reported, and arcs S3→S0 and S4→S0 that are all arcs that never occur transitions from the states are extracted.

In step (S57), it is discriminated whether or not there is a transition. If it is discriminated as a result that there is no transition, the process terminates. If there is the transition, control is returned to step (S54).

Figure 7:
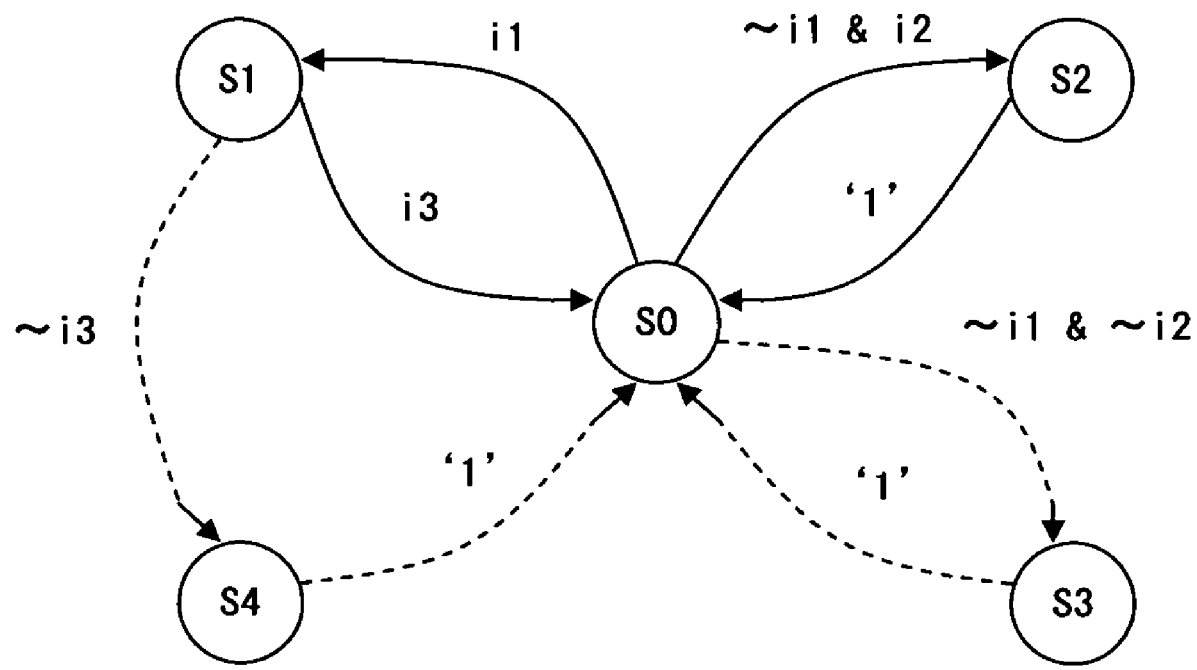
FIG. 7 shows the transition of the FSM of the RTL description shown in FIG. 5.

The view of the transition of the FSM shown in FIG. 7 is explained below. That is, the reset (RST signal) described in line 26 shown in FIG. 5 sets the initial state to S0 (S0 is also described as default in line 40). Then, if the input i1 is high, that is, 1 (line 32) in the state S0, the state changes to S1 (arc i1 shown in FIG. 7). Then, if i1 is low and i2 is high, that is, (~i1 & i2) is high (line 33) in the state S0, then the state changes to S2 (arc~i1 & i2 shown in FIG. 7). Otherwise, the state changes to S3 (dotted arc~i1 & i2 shown in FIG. 7).

When i3 is high (line 35) in the state S1, the state is changed to S0 (arc i3 shown in FIG. 7). When ~i3 is used, that is, i3 is low (line 36), the state is changed to S4 (dotted arc~i3 shown in FIG. 7). The return from the states S2, S3, and S4 changes the state to S0 (arc '1' shown in FIG. 7) unconditionally (lines 37 through 39).

As described above, when the module in which the FSM is described is set as an instance, there can be a case where a constant or a variable being constant as a result of a logical calculation is connected to the input of the lower module. If the total amount of coverage is extracted only by the FSM description in the module "sample1_fsm", the number of states is five, that is, S0, S1, S2, S3, and S4, and the number of arcs is eight, that is, S0→S1, S0→S2, S0→S3, S1→S0, S1→S4, S2→S0, S3→S0, and S4→S0.

When the logical extraction is performed by the trace back from the variables (i1, i2, and i3) as input of the FSM to the top module "sample1", the constant (1'b1) is connected to the pin i2, and variable (W) as a constant by the logical calculation is connected to the pin i3. As a result, when a constant propagation is performed, the transition condition for the arcs S0→S3 and S1→S4 never occur, and the transitions to the states S3 and S4 are performed through the corresponding arcs. Therefore, the states S3 and S4 are the states that are never reached, and the transitions from the states S3 and S4 never occur. Therefore, the total amount of coverage is represented by the number of states of 3, that is, S0, S1, and S2, and the number of arcs of 4, that is, S0→S1, S0→S2, S1→S0, and S2→S0.

As a result, the transitions indicated by the dotted arrows shown in FIG. 7 do not occur, and the result shown in FIG. 8 is obtained. FIG. 8 shows the result of conducting a test 5000 times, and FIG. 8A shows the result of performing the conventional FSM state coverage measurement on the description shown in FIG. 5. Since the states S3 and S4 cannot be reached, the result is 60% (3/5). FIG. 8B shows the result of performing the conventional FSM arc coverage measurement, and four transitions that never occur. Therefore, the result is 50% (4/8).

However, in FIGS. 8C and 8D, since a state that is never reached and a transition that never occurs are subtracted from the denominator before the coverage measurement, the results are 100%.

With the above-mentioned configuration, for example, although an error description (including an intentional description) is performed in the source 21, the checking time can be shortened by performing the coverage measurement automatically excluding the FSM error descriptions.

(Check of Logical Optimization)

When a module including the description of an FSM is defined as an instance, there can be a case where the logic for connection to the input of a lower module has an influence on the logic to the input of the FSM, and the logic never occurs exclusively. FIG. 9 shows an RTL description (source 21) with the configuration of "sample2" as a top module followed by lower modules "sample2_ff" and "sample2_fsm".

First, when the total amount of coverage is extracted only by the FSM description in the module "sample2_fsm", the number of states is five, that is S0, S1, S2, S3, and S4, and the number of arcs is 11, that is, S0→S1, S0→S2, S0→S3, S0→S4, S1→S0, S1→S1, S1→S2, S1→S4, S2→S0, S3→S0, and S4→S0.

The range from the trace back from the variables C0, C1, C2, and C3 as input in the FSM description to the external input pin of the top module "sample2" or the FF output is logically extracted. When the optimization to the input logic of the FSM is performed, there is the exclusivity that the transition condition of (C1) as (1'b1), (C2) as (1'b0), and (C3) as (1'b0) never occurs in the input variable (i1, R, i3) as shown in FIG. 10 in state S0. Thus, the arc S0→S3 never occurs, and the transition to S3 is performed only through the corresponding arc. Therefore, the state S3 is never reached, and the arc for transition from S3 never occurs. Therefore, the total amount of coverage is represented by the number of states of four, that is, S0, S1, S2, and S4, and the number of arcs of nine, that is, S0→S1, S0→S2, S0→S4, S1→S0, S1→S1, S1→S2, S1→S4, S2→S0, and S4→S0.

In S1 indicating the similar transition condition, since i2 is before and after FF ("sample2_ff") as shown in FIG. 11, the exclusive logic does not hold, but all transitions occur. Thus, the condition described in lines 59 through 67 are all satisfied.

Figure 12:
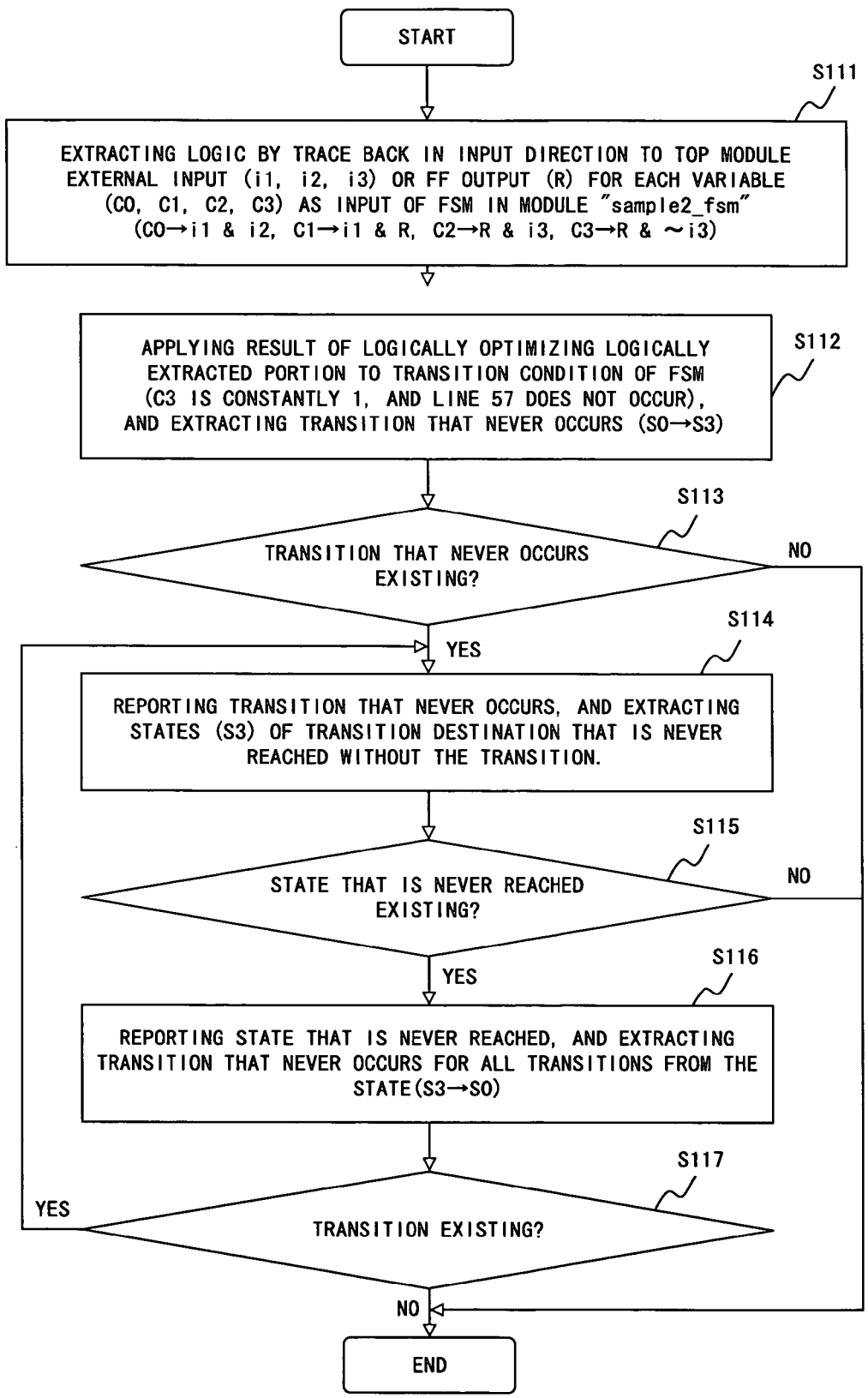
FIG. 12 shows the flow of the process performed based on the RTL description shown in FIG. 9.

The process above is explained by referring to the flowchart shown in FIG. 12.

In step (S111), the logical extraction is performed by the trace back in the input direction up to an external input (i1, i2, and i3) of the top module for each variable (C0, C1, C2, and C3) as the input of the FSM in the module "sample2_fsm", or to the FF output (R). In the present embodiment, the arcs C0→i1 & i2, C1→i1 & R, C2→R & i3, and C3→R & ~i3 are extracted.

In step (S112),the result of logically optimizing the logically extracted portion is applied to the transition condition of the FSM, C3 is constantly high, that is, "1" (line 57 does not occur) when C1 & C2 is high. The arc S0→S3 that never occurs is extracted.

In step (S113), it is discriminated whether or not there is a transition that never occurs. If there is no transition that never occurs, the process terminates. If there is, control is passed to step S114.

Instep (S114), a transition that never occurs is reported, and a state S3 that is the destination state of the transition, and is never reached without the transition is extracted.

In step (S115), it is discriminated whether or not there is a state that is never reached. If there is no state that is never reached, the process terminates. If there is, control is passed to step S116.

In step (S116), a state that is never reached is reported, and the arc S3→S0 through which all transitions from the state never occur is extracted.

In step (S117), it is discriminated whether or not there is a transition. If there is no transition, the process terminates. If there is, control is returned to step S114.

Figure 13:
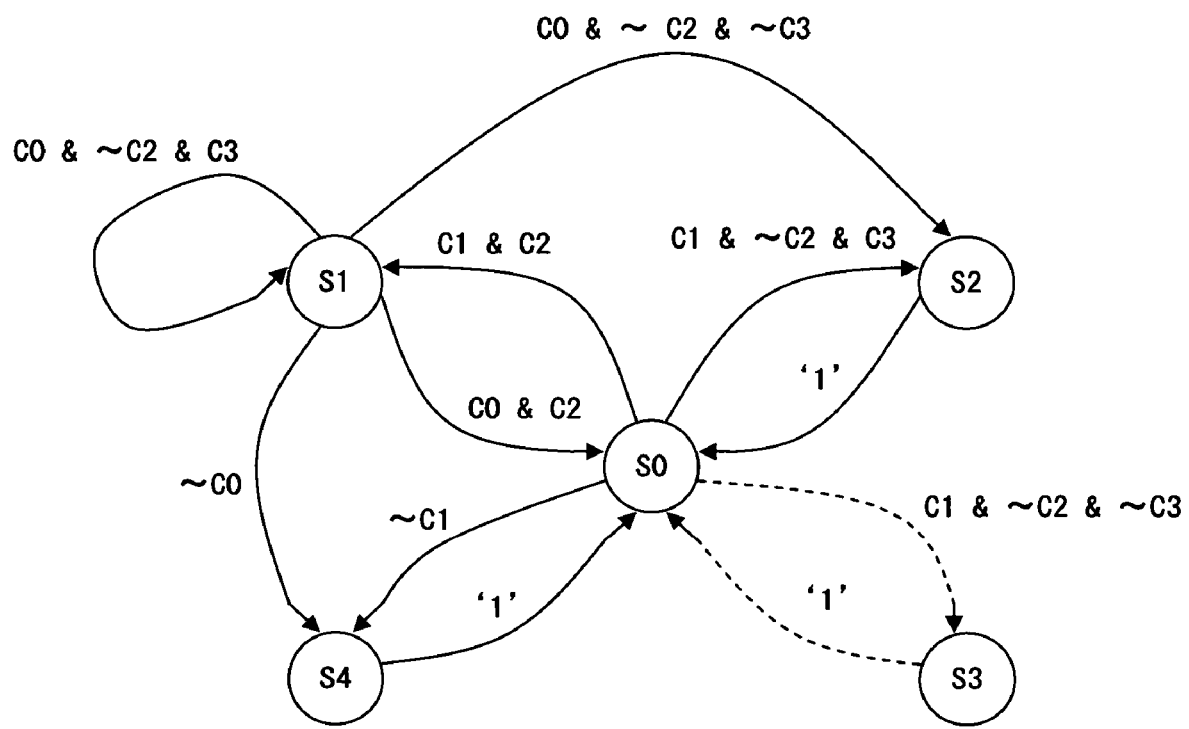
FIG. 13 shows the transition of the FSM of the RTL description shown in FIG. 9.

When the process above is explained by referring to the FSM transition view shown in FIG. 13, there is a transition considered to the states S1 through S4 with state S0 defined as a default. That is, they are: the transition (arc C1 & C2 shown in FIG. 13) to S1 described in line 55 shown in FIG. 9; the transition (arc C1 & ~C2 & C3 shown in FIG. 13) to S2 described in line 56 shown in FIG. 9; the transition (arc C1 & ~C2 & ~C3 shown by dotted line in FIG. 13) to S3 described in line 57 shown in FIG. 9; and the transition (arc~C1 shown in FIG. 13) to S4 described in line 58 shown in FIG. 9.

The transitions from S1 are: the transition (arc C0 & ~C2 & C3 shown in FIG. 13) to loop to S1, the transition back to S0 (arc C0 & C2 shown in FIG. 13), the transition (arc C0 & ~C2 & ~C3 shown in FIG. 13) to S2, and the transition (arc C0 shown in FIG. 13) to S4, which are described in lines 59 through 63 in FIG. 9 respectively.

The transition from S2, S3, and S4 is performed to S0 (arc'1' shown in FIG. 13) unconditionally as described in lines 64 through 66 shown in FIG. 9.

However, since no transition occurs through the arc S0→S3 indicated by the dotted arrow, the state S3 is never reached. Therefore, there is no arc to return to S3→S0. The transition for no return to the state is also extracted.

FIG. 14 shows an FSM coverage measurement result. In FIG. 14A, the result of the conventional FSM coverage measurement is 80% (4/5) since S3 is not reached. In FIG. 14B, there are two 2-arcs as described above, the result is 81% (9/11). In FIGS. 14C and 14D, the logical optimization is applied to FSM coverage measurement. Therefore, since a state that is never reached and a transition that never occurs are subtracted, the result is 100%.

With the above-mentioned configuration, for example, although an error description (including an intentional description) is described in the source 21, the coverage measurement is performed by automatically removing the error description of the FSM, thereby shortening the checking time.

Embodiment 2

When an FSM register variable or its derivative variable is described in the logic determining a transition destination in the state of the FSM, and the FSM register variable and the derivative variable are used in the transition condition other than the state branch or as the next state, it is hard to attain 100% of FSM coverage. The RTL description shown in FIG. 15 includes a derivative variable (state) as a derivative from the register variable (cur_stat,nxt_stat) described in the FSM in lines 28 through 52, and has the descriptions of the comparison condition with the derivative variable (state) in the state S3, the comparison condition with the register variable (cur_state) in the state S5, and the assignment to the transition destination to the derivative variable (state).

Figure 16:
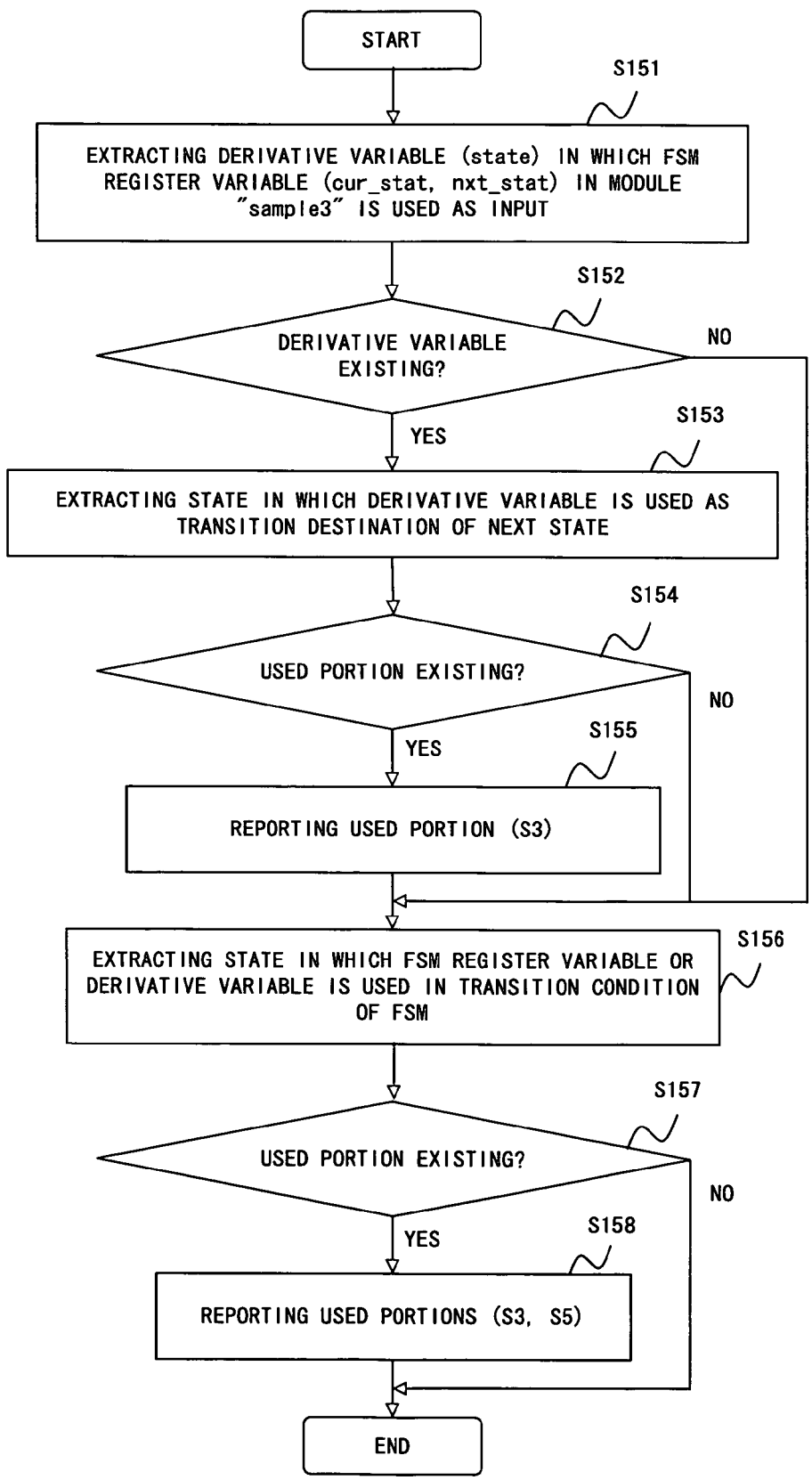
FIG. 16 shows the flow of the process according to the embodiment 2.

FIG. 16 shows the extracting process about the case shown in FIG. 16.

In step (S151), the derivative variable using the FSM register variable (cur_stat,nxt_stat) in the module "sample3" as an input is extracted. In the present example, (state) is extracted (derivative variable extracting function).

In step (S152), it is discriminated whether or not there is the derivative variable. For example, when the description shown in FIG. 15 or the design information is checked and there is no derivative variable, control is passed to step (S156). If there is, control is passed to step (S153).

In step (S153), the state in which a derivative variable is used as a transition destination of the next state is extracted (first state extracting function). In the present example, the state S5 is extracted.

In step (S154), it is discriminated whether or not there is a used portion. If there is no portion, control is passed to step (S156). If there is, control is passed to step (S155). In this example, a derivative variable is described in line 47, and a transition is performed to the state S5.

In step (S155), the state S5 is reported as a used portion.

In step (S156), the state in which the FSM register variable or the derivative variable is used in the transition condition of an FSM is extracted (second state extracting function). In the present example, the states S3 and S5 are extracted.

In step (S157), it is discriminated whether or not there is a used portion. If there are no such portions, the process terminates. If there is, control is passed to step (S158). In the present embodiment, the FSM register variable and the derivative variable are used in the states S3, S5 described in lines 41 through 43, and 45 through 49.

In step (S158), the states S3 and S5 are reported as used portions.

As a result of the check in the above-mentioned flowchart, there are two states, that is, the states S3 and S5, in which the FSM register and the derivative variable are used in the transition condition, and the state in which the derivative variable is used as a transition destination is S5.

With the above-mentioned configuration, the FSM in which the register variable is used in the transition condition, and the state in which the register of the FSM is used on the transition logic can be extracted from the RTL description (source 21). Based on the result, attention is directed to rewrite the source 21.

Using one or more computers having the above-mentioned hardware configuration, the various processing functions described above can be realized. By allowing the computer to execute the program, the processing functions are read by the computer. The program describing the contents of the processing can be recorded on a computer-readable recording medium.

When a program is distributed, for example, a portable recording medium such as a DVD, CD-ROM, etc. is marketed. Additionally, the program can be stored in the storage device of the server computer, and can be transferred from the server computer to another computer over a network.

The computer for executing the program stores, for example, a program stored in a portable recording medium or a program transferred from the server computer in the storage device of the computer. Then, the computer reads the program from its own storage device, and executes the process according to the program. The computer directly reads the program from a portable recording medium, and can perform a process according to the program. The computer can also perform a process according to the sequentially received programs each time a program is transferred from the server computer.

Furthermore, the present invention is not limited to the above-mentioned embodiments, and can be improved and amended within the scope of the gist of the present invention.

What is claimed is:

1. A computer-readable recording medium storing a program for use in FSM coverage measurement based on a language-described logical circuit and a test bench to direct a computer to perform:
   extracting a FSM configuration from a language description and design information generated based on the language description;
   expanding hierarchical levels of modules in a range of performing trace back from a variable as input of a FSM to output of a flip-flop or external input of a top module;
   extracting FSM input logic between the hierarchical levels in response to input of a module;
   detecting whether or not there is a state that is not reached or a transition that does not occur by an arithmetic result based on logic having exclusivity detected in the FSM input logic and a FSM transition logic; and
   outputting a result of the detecting.

2. The recording medium according to claim 1, wherein:
   the detecting detects by constant propagation whether or not there is a state that is not reached or a transition that does not occur according to an arithmetic result based on a constant propagation logic detected in the FSM input logic and the FSM transition logic.

3. The recording medium according to claim 1, wherein the computer is also directed to perform:
   optimizing the expanding hierarchical levels and the extracting FSM input logic, and detects whether or not there is a state that is not reached or a transition that does not occur according to an arithmetic result based on the exclusive logic detected in the optimized FSM input logic and the FSM transition logic.

4. The recording medium according to claim 1, wherein:
   the detecting includes subtracting a number of states that are not reached from a total amount of a FSM state coverage, subtracting a number of transitions that do not occur from a total amount of a FSM arc coverage, performing measurement of coverage and calculating a coverage rate, and outputting a result of the calculation.

5. A computer-readable recording medium storing a program for use in FSM coverage measurement based on a language-described logical circuit and a test bench to direct a computer to perform:
   extracting a configuration of a FSM from a language description and design information generated based on the language description;

extracting a derivative variable in which a FSM register variable of a FSM is used as input;

extracting a state in which the derivative variable is used as a transition destination of a next state;

extracting a state in which the FSM register variable or the derivative variable is used as a transition condition of a FSM; and displaying a result of at least one of the extracting the derivative variable in which the FSM register variable of the FSM is used as input and the extracting the state in which the FSM register variable or the derivative variable is used as the transition condition of the FSM.

6. The recording medium according to claim 5, wherein:

the displayed result is an arithmetic result detected by the extracting the derivative variable in which the FSM register variable of the FSM is used as input.

7. The recording medium according to claim 5, wherein:

the displayed result is an arithmetic result detected by the extracting the state in which the FSM register variable or the derivative variable is used as the transition condition of the FSM.

8. A designing apparatus which performs FSM coverage measurement based on a language-described logical circuit and a test bench, comprising:

a FSM check unit to extract a FSM configuration from a language description and design information generated based on the language description, expand hierarchical levels of modules in a range of performing trace back from a variable as input of a FSM to output of a flip-flop or external input of a top module, perform constant propagation and optimization, check before executing a simulation whether or not there is a state that is not reached or a transition that does not occur, and output the check result; and a FSM coverage measurement unit to subtract the state that is not reached from a total amount of a FSM state coverage, subtract the transition that does not occur from a total amount of a FSM arc coverage, perform the FSM coverage measurement based on the test bench, and output a FSM coverage result.

9. The apparatus according to claim 8, wherein:

the FSM check unit is also to extract a derivative variable in which a FSM register variable of the FSM is used as input, a state in which the derivative variable is used as a transition destination of the next state and a state in which the FSM register variable or the derivative variable is used as a transition condition of the FSM.

10. The apparatus according to claim 9, wherein:

an arithmetic result based on the state in which the derivative variable is used as a transition destination of the next state detected by the FSM check unit is displayed.

11. The apparatus according to claim 9, wherein:

an arithmetic result based on the state in which the FSM register variable or the derivative variable is used as a transition condition of the FSM detected by the FSM check unit is displayed.

12. The apparatus according to claim 8, wherein:

the FSM check unit detects by constant propagation whether or not there is a state that is not reached or a transition that does not occur according to an arithmetic result based on a constant propagation logic detected in a FSM input logic and a FSM transition logic.

13. The apparatus according to claim 8, wherein:

the FSM check unit detects whether or not there is a state that is not reached or a transition that does not occur according to an arithmetic result based on exclusive logic detected in the optimized FSM input logic and the FSM transition logic.

14. The apparatus according to claim 8, wherein:

an output of the FSM check unit is a result of subtracting a number of states that are not reached from the total amount of the FSM state coverage, subtracting a number of transitions that do not occur from a total amount of the FSM arc coverage, performing a coverage measurement and calculating a coverage rate.

* * * * *